United States Patent
Albano et al.

(10) Patent No.: US 11,539,070 B2
(45) Date of Patent: Dec. 27, 2022

(54) METHOD FOR MANUFACTURE AND STRUCTURE OF MULTIPLE ELECTROCHEMISTRIES AND ENERGY GATHERING COMPONENTS WITHIN A UNIFIED STRUCTURE

(71) Applicant: Sakti3, Inc., Ann Arbor, MI (US)

(72) Inventors: Fabio Albano, Ann Arbor, MI (US); Chia Wei Wang, Ypsilanti, MI (US); Ann Marie Sastry, Ann Arbor, MI (US)

(73) Assignee: SAKTI3, INC., Ann Arbor, MI (US)

( * ) Notice: Subject to any disclaimer, the term of this patent is extended or adjusted under 35 U.S.C. 154(b) by 0 days.

(21) Appl. No.: 15/595,872

(22) Filed: May 15, 2017

(65) Prior Publication Data
US 2017/0250441 A1    Aug. 31, 2017

Related U.S. Application Data

(63) Continuation of application No. 14/060,387, filed on Oct. 22, 2013, now abandoned, which is a
(Continued)

(51) Int. Cl.
*H01M 10/04* (2006.01)
*H01M 10/0562* (2010.01)
(Continued)

(52) U.S. Cl.
CPC ........ *H01M 10/0562* (2013.01); *H01G 11/04* (2013.01); *H01G 11/34* (2013.01);
(Continued)

(58) Field of Classification Search
CPC ........ H01M 6/40; H01M 6/41; H01M 4/0421; H01M 16/00; H01M 4/382; H01M 4/505;
(Continued)

(56) References Cited

U.S. PATENT DOCUMENTS 4,740,431 A     4/1988   Little
5,569,520 A  *  10/1996  Bates .................. H01M 4/0447
                                                    429/162
(Continued)

FOREIGN PATENT DOCUMENTS

CN           1619876       5/2005
EP           0 108 492     5/1984
(Continued)

OTHER PUBLICATIONS

Machine translation of JP 2005-056655A, Kanbe Chicka, 2005 (Year: 2005).*

(Continued)

*Primary Examiner* — Kwang Han
(74) *Attorney, Agent, or Firm* — Faegre Drinker Biddle & Reath LLP

(57) ABSTRACT

A method for using an integrated battery and device structure includes using two or more stacked electrochemical cells integrated with each other formed overlying a surface of a substrate. The two or more stacked electrochemical cells include related two or more different electrochemistries with one or more devices formed using one or more sequential deposition processes. The one or more devices are integrated with the two or more stacked electrochemical cells to form the integrated battery and device structure as a unified structure overlying the surface of the substrate. The one or more stacked electrochemical cells and the one or more devices are integrated as the unified structure using the one or more sequential deposition processes. The integrated battery and device structure is configured such that the two or more stacked electrochemical cells and one or more devices are in electrical, chemical, and thermal conduction with each other.

25 Claims, 4 Drawing Sheets

Related U.S. Application Data continuation of application No. 13/465,243, filed on May 7, 2012, now Pat. No. 8,597,722, which is a continuation of application No. 12/614,169, filed on Nov. 6, 2009, now Pat. No. 8,192,789.

(60) Provisional application No. 61/112,707, filed on Nov. 7, 2008.

(51) Int. Cl.

| | | |
|---|---|---|
| *H01M 10/42* | (2006.01) | |
| *H01M 4/04* | (2006.01) | |
| *H01M 4/38* | (2006.01) | |
| *H01M 4/505* | (2010.01) | |
| *H01M 4/58* | (2010.01) | |
| *H01M 6/40* | (2006.01) | |
| *H01G 11/04* | (2013.01) | |
| *H01G 11/34* | (2013.01) | |
| *H01L 31/0224* | (2006.01) | |
| *H01L 31/18* | (2006.01) | |
| *H01M 10/46* | (2006.01) | |
| *H01M 12/08* | (2006.01) | |
| *H01M 16/00* | (2006.01) | |
| *H02S 40/38* | (2014.01) | |
| *H01M 8/10* | (2016.01) | |

(52) U.S. Cl.
CPC .. *H01L 31/022441* (2013.01); *H01L 31/1804* (2013.01); *H01M 4/0402* (2013.01); *H01M 4/045* (2013.01); *H01M 4/0419* (2013.01); *H01M 4/0421* (2013.01); *H01M 4/0423* (2013.01); *H01M 4/0426* (2013.01); *H01M 4/0428* (2013.01); *H01M 4/382* (2013.01); *H01M 4/505* (2013.01); *H01M 4/5825* (2013.01); *H01M 6/40* (2013.01); *H01M 10/0436* (2013.01); *H01M 10/4264* (2013.01); *H01M 10/465* (2013.01); *H01M 12/08* (2013.01); *H01M 16/00* (2013.01); *H01M 16/003* (2013.01); *H02S 40/38* (2014.12); *H01M 16/006* (2013.01); *H01M 2008/1095* (2013.01); *H01M 2300/0068* (2013.01); *Y02E 60/10* (2013.01); *Y10T 29/49108* (2015.01); *Y10T 29/49115* (2015.01)

(58) Field of Classification Search
CPC ............ H01M 4/5825; H01M 10/465; H01M 4/0402; H01M 4/0419; H01M 4/0426; H01M 4/045; H01M 12/005; H01M 4/0423; H01M 4/0428; H01M 16/006; H01M 2008/1095; H01M 2300/0068; H01M 10/0562; H01M 10/0436; H01M 10/4264; H01M 16/003; H01M 10/04; H01M 12/08; H01L 49/02; H01L 51/00; H01L 51/0008; H01L 51/5203; H01L 31/022441; H01L 31/1804; H02S 40/38; H01G 11/34; H01G 11/04; Y02E 60/10; Y02E 60/50; Y02E 60/13; Y02E 10/547; Y02E 70/30; Y10T 29/49108; Y10T 29/49115; Y02P 70/50

See application file for complete search history.

(56) References Cited

U.S. PATENT DOCUMENTS

| | | | |
|---|---|---|---|
| 6,083,637 A | 7/2000 | Walz et al. | |
| 6,650,000 B2 | 11/2003 | Ballantine et al. | |
| 6,664,786 B2 | 12/2003 | Kretschmann et al. | |
| 7,150,931 B1 | 12/2006 | Jaffrey | |
| 7,862,927 B2 | 1/2011 | Krasnov et al. | |
| 8,192,789 B2 | 6/2012 | Albano et al. | |
| 8,334,464 B2 | 12/2012 | Edwards et al. | |
| 2002/0012846 A1* | 1/2002 | Skotheim | H01M 2/1673 429/231.95 |
| 2003/0044662 A1 | 3/2003 | Walsh | |
| 2004/0185310 A1 | 9/2004 | Jenson et al. | |
| 2005/0073314 A1 | 4/2005 | Bertness et al. | |
| 2005/0079418 A1 | 4/2005 | Kelley et al. | |
| 2005/0147877 A1* | 7/2005 | Tarnowski | H01M 2/0207 429/162 |
| 2005/0258801 A9 | 11/2005 | Johnson et al. | |
| 2006/0038536 A1 | 2/2006 | LaFollette et al. | |
| 2006/0055175 A1 | 3/2006 | Grinblat | |
| 2007/0190418 A1 | 8/2007 | Chiang et al. | |
| 2009/0288943 A1* | 11/2009 | Kwak | H01M 4/525 204/192.12 |
| 2010/0196744 A1 | 8/2010 | Tucholski et al. | |

FOREIGN PATENT DOCUMENTS

| | | | | |
|---|---|---|---|---|
| GB | 2 420 027 | | 5/2006 | |
| JP | 9-171842 | | 6/1997 | |
| JP | 2002-170975 | | 6/2002 | |
| JP | 2005-056655 A | * | 3/2005 | ............ H01M 10/05 |
| JP | 2006-40636 | | 2/2006 | |
| KR | 10-2008-0070828 | | 7/2008 | |
| KR | 10-2008-0080900 | | 9/2008 | |
| WO | WO-2007/061928 | | 5/2007 | |
| WO | WO-2008/035258 | | 3/2008 | |

OTHER PUBLICATIONS

Office Action dated Sep. 27, 2012, directed to CN Application No. 2009/80144551.2; 23 pages.

Extended European Search Reported dated Feb. 27, 2014, directed to EP Application No. 09825485.7; 8 pages.

International Search Report and Written Opinion dated Dec. 29, 2009, directed to International Application No. PCT/US2009/063571; 8 pages.

Albano et al., U.S. Office Action dated Dec. 2, 2010, directed to U.S. Appl. No. 12/614,169; 11 pages.

Albano et al., U.S. Office Action dated Mar. 11, 2011, directed to U.S. Appl. No. 12/614,169; 15 pages.

Albano et al., U.S. Office Action dated Oct. 27, 2011, directed to U.S. Appl. No. 12/614,169; 14 pages.

Albano et al., U.S. Office Action dated Dec. 17, 2012, directed to U.S. Appl. No. 13/465,243; 7 pages.

Albano et al., U.S. Office Action dated Apr. 4, 2016, directed to U.S. Appl. No. 14/060,387; 10 pages.

Albano et al., U.S. Office Action dated Nov. 15, 2016, directed to U.S. Appl. No. 14/060,387; 10 pages.

* cited by examiner

METHOD FOR MANUFACTURE AND STRUCTURE OF MULTIPLE ELECTROCHEMISTRIES AND ENERGY GATHERING COMPONENTS WITHIN A UNIFIED STRUCTURE

REFERENCE TO RELATED APPLICATIONS

This application is a continuation of U.S. patent application Ser. No. 14/060,387, filed Oct. 22, 2013, which is a continuation of U.S. patent application Ser. No. 13/465,243 filed May 7, 2012, now U.S. Pat. No. 8,597,722, which is a continuation of U.S. patent application Ser. No. 12/614,169 filed Nov. 6, 2009, now U.S. Pat. No. 8,192,789, which claims priority to U.S. Provisional Patent Application No. 61/112,707 filed Nov. 7, 2008, the entire contents of which are incorporated herein by reference.

SUMMARY OF THE INVENTION

According to the present invention, techniques related to energy devices are provided. More particularly, embodiments of the present invention relate to methods to design, manufacture, and structure a multi-component energy device having a unified structure. The individual components can include electrochemical cells, photovoltaic cells, fuel-cells, capacitors, ultracapacitors, thermoelectric, piezoelectric, micro electromechanical turbines, or energy scavengers. The methods and systems described herein are also applicable to a variety of energy systems.

According to an embodiment of the present invention, a method for using an integrated battery and device structure is provided. The method includes using two or more stacked electrochemical cells integrated with each other formed overlying a surface of a substrate. The two or more stacked electrochemical cells include related two or more different electrochemistries with one or more devices formed using one or more sequential deposition processes. The one or more devices are integrated with the two or more stacked electrochemical cells to form the integrated battery and device structure as a unified structure overlying the surface of the substrate. The one or more stacked electrochemical cells and the one or more devices are integrated as the unified structure using the one or more sequential deposition processes. The integrated battery and device structure is configured such that the two or more stacked electrochemical cells and one or more devices are in electrical, chemical, and thermal conduction with each other.

Numerous benefits are achieved by way of the present invention over conventional techniques. For example, electrochemical cells described herein present multiple chemistries to accommodate a wider range of voltage and current compared to individual ones. Additionally, energy-scavenging elements are utilized to collect energy and replenish it to other components within the unified structure. Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF THE INVENTION

Example 1

Figure 1:
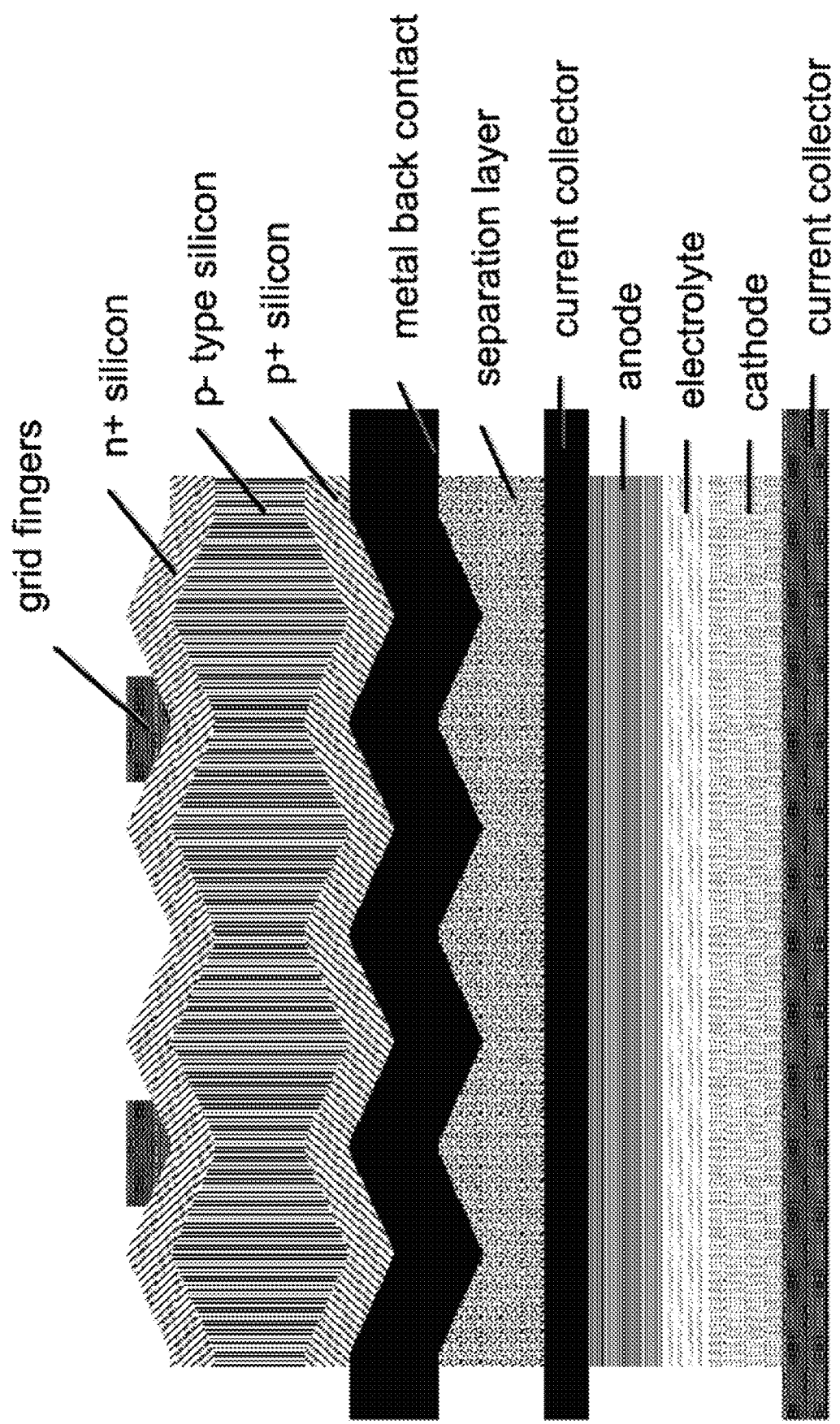
FIG. 1—Simplified cross-sectional view of a unified structure including an integrated silicon (Si) solar cell and a thin film battery.

A Unified Structure Including a Silicon (Si) Solar Cell and a Thin Film Battery and Their Manufacturing Method Preparing a stacked cell on the back surface of a silicon (Si) solar cell as shown in FIG. 1 can be achieved by forming the cell components using physical vapor deposition. A solar cell exploiting p-type silicon is constructed using traditional Si wafers (Czochralski method). After forming a p-n junction by diffusing phosphorous (P) into the wafer, an aluminum (Al) back contact is created (metal back contact in FIG. 1), onto the p+ doped region (lower side) of the silicon wafer, using physical vapor deposition. The aluminum layer is grown to a thickness of 1-2 µm.

After the back metal contact is created, a separation layer of electrically insulating and thermally conductive aluminum nitride (AlN), having a thickness of 3-5 µm, is fabricated onto the aluminum layer using PVD. This layer has the function of removing heat from the two elements and convey it to a heat sink.

After the cooling element is completed, the battery components are deposited sequentially and conformally by a physical vapor deposition (PVD) process: an aluminum (Al) current collector layer (1-3 µm thick), a lithium manganese oxide ($LiMn_2O_4$) cathode layer (3-5 µm thick), a lithium phosphorous oxynitride (UPON) ceramic electrolyte layer (1-3 µm thick), a lithium (Li) metal anode layer (3-5 µm thick), and a copper (Cu) current collector layer (1-3 µm thick), respectively.

Example 2

Figure 2:
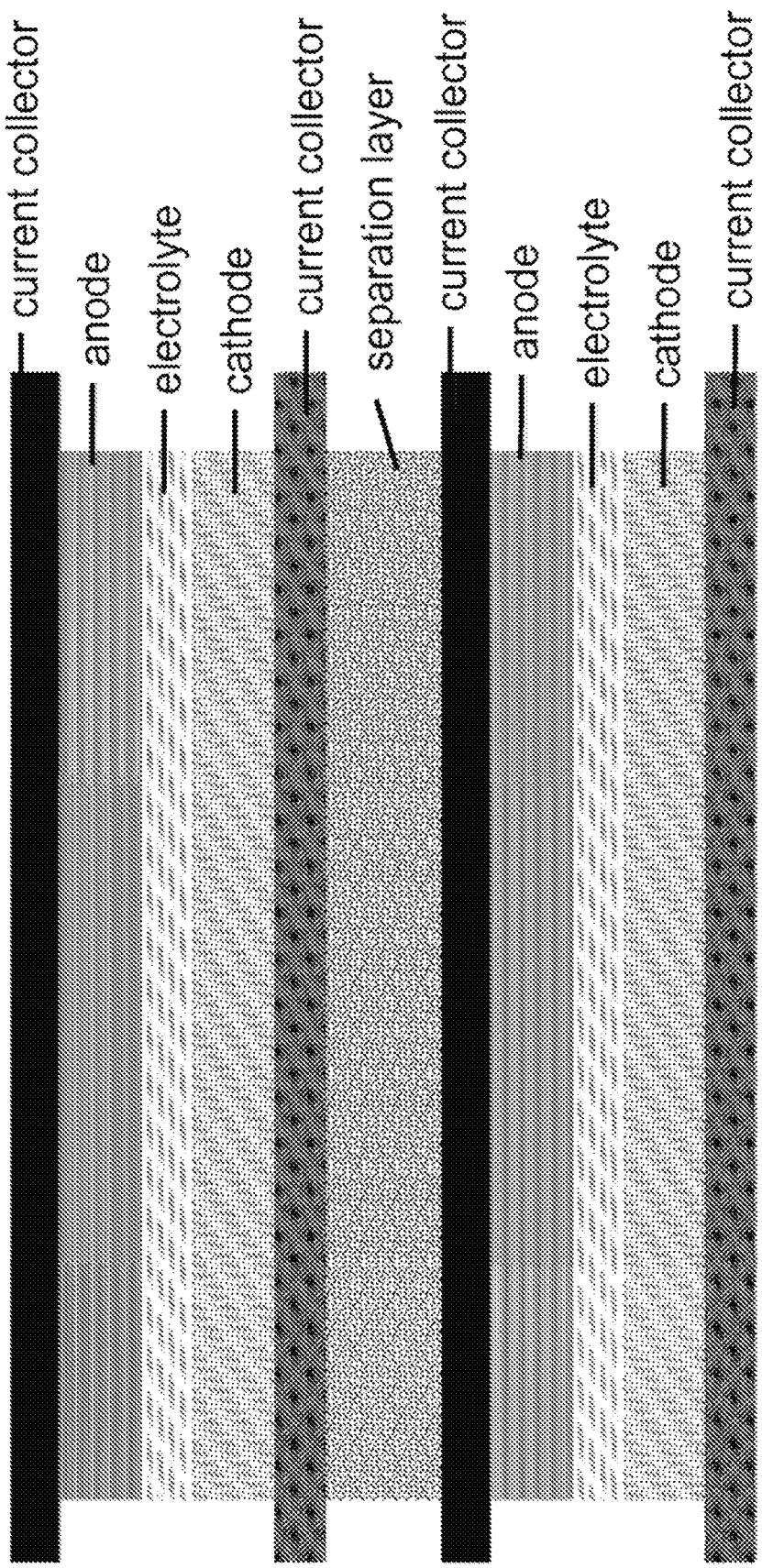
FIG. 2—Simplified cross-sectional view of a unified structure including two integrated thin film batteries having different chemistry.

A Unified Structure Including Two Thin Film Batteries Having Different Chemistry and Their Manufacturing Method Two stacked cells having different electrochemistries are fabricated onto each other by using physical vapor deposition as reported in FIG. 2.

The first battery components are deposited using a PVD process onto an aluminum (Al) metal film used as cathode current collector: a lithium iron phosphate ($LiFePO_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

After the copper (Cu) metal current collector is created, a separation layer of electrically insulating and thermally conductive aluminum nitride (AlN), having a thickness of 3-5 µm, is fabricated onto the copper layer using PVD. This layer has the function of removing heat from the two elements and convey it to a heat sink.

After the cooling element is completed, the second battery components are deposited sequentially and conformally by a PVD process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

Example 3

Figure 3:
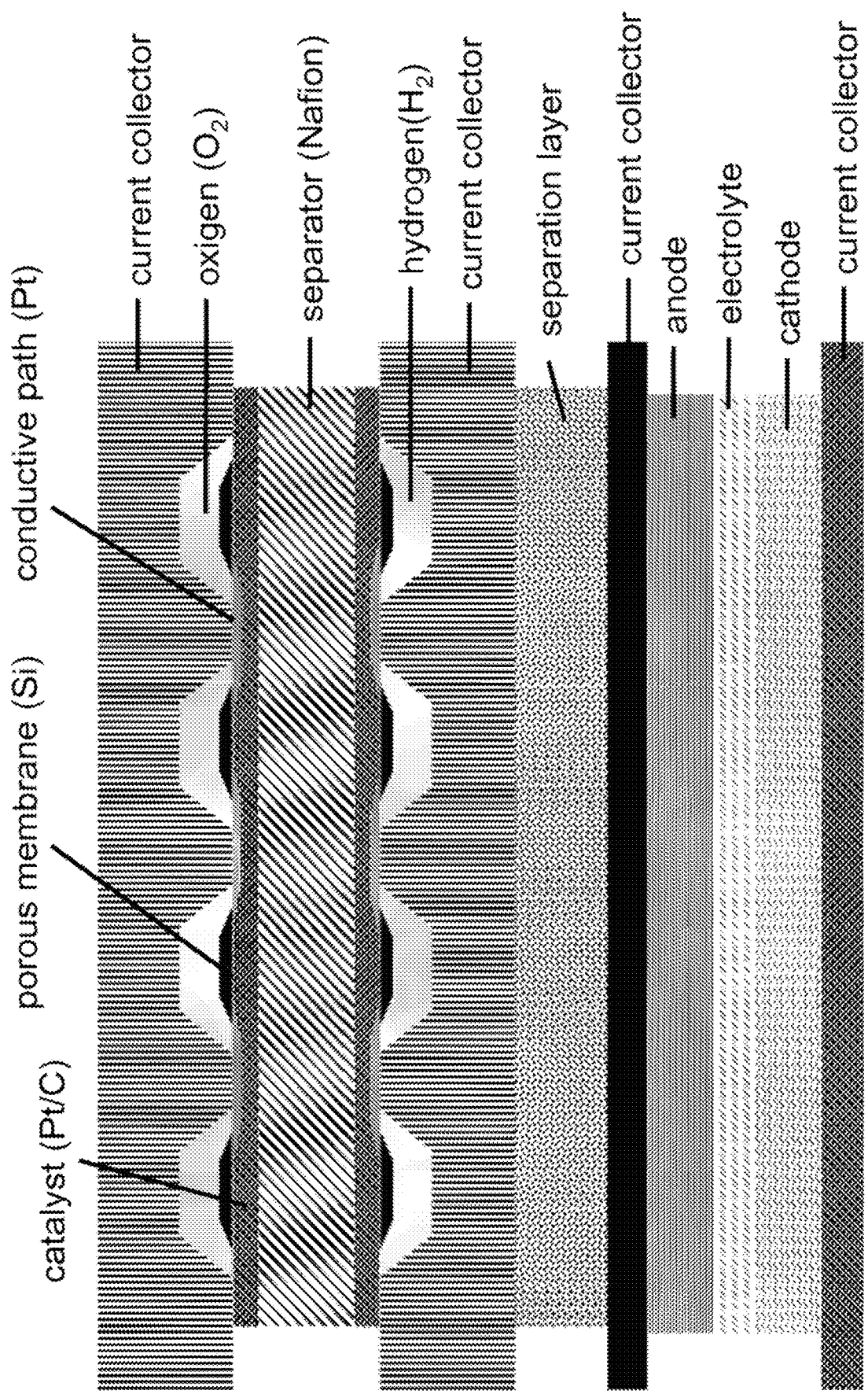
FIG. 3—Simplified cross-sectional view of a unified structure including an integrated hydrogen/oxygen fuel-cell and a thin film battery.

A Unified Structure Including a Fuel-Cell and a Thin Film Battery and Their Manufacturing Method Preparing a stacked cell on the back surface of a proton-exchange membrane (PEM) fuel-cell as shown in FIG. 3 can be achieved by forming the cell components using physical vapor deposition (PVD). A PEM fuel-cell exploiting proton exchange membranes with high proton conductivity, employing perfluorosulfonate ionomers electrolytes such as Nation®, is constructed using traditional sol-gel methods for fabricating the membrane and wet slurry for the electrodes.

After assembly of the fuel-cell a separation layer of electrically insulating and thermally conductive aluminum nitride (AlN), having a thickness of 3-5 µm, is fabricated onto the fuel-cell current collector using PVD. This layer has the function of removing heat from the two elements and conveying it to a heat sink.

After the cooling element is completed, the battery components are deposited sequentially and conformally by a PVD process. Respectively an aluminum (Al) current collector layer (1-3 µm thick), a lithium manganese oxide ($LiMn_2O_4$) cathode layer (3-5 µm thick), a lithium phosphorous oxynitride (UPON) ceramic electrolyte layer (1-3 µm thick), a lithium (Li) metal anode layer (3-5 µm thick) and a copper (Cu) current collector layer (1-3 µm thick).

Example 4

A Unified Structure Including an Ultra-Capacitor and a Thin Film Battery and Their Manufacturing Method Preparing a stacked cell on the back surface of an electrochemical double layer capacitor (EDLC), which is also known as an ultra-capacitor) as shown in FIG. 3 can be achieved by forming the cell components using PVD. In such a hybrid system, the battery provides high energy density while the EDLC enables high power capability in the system.

Figure 4:
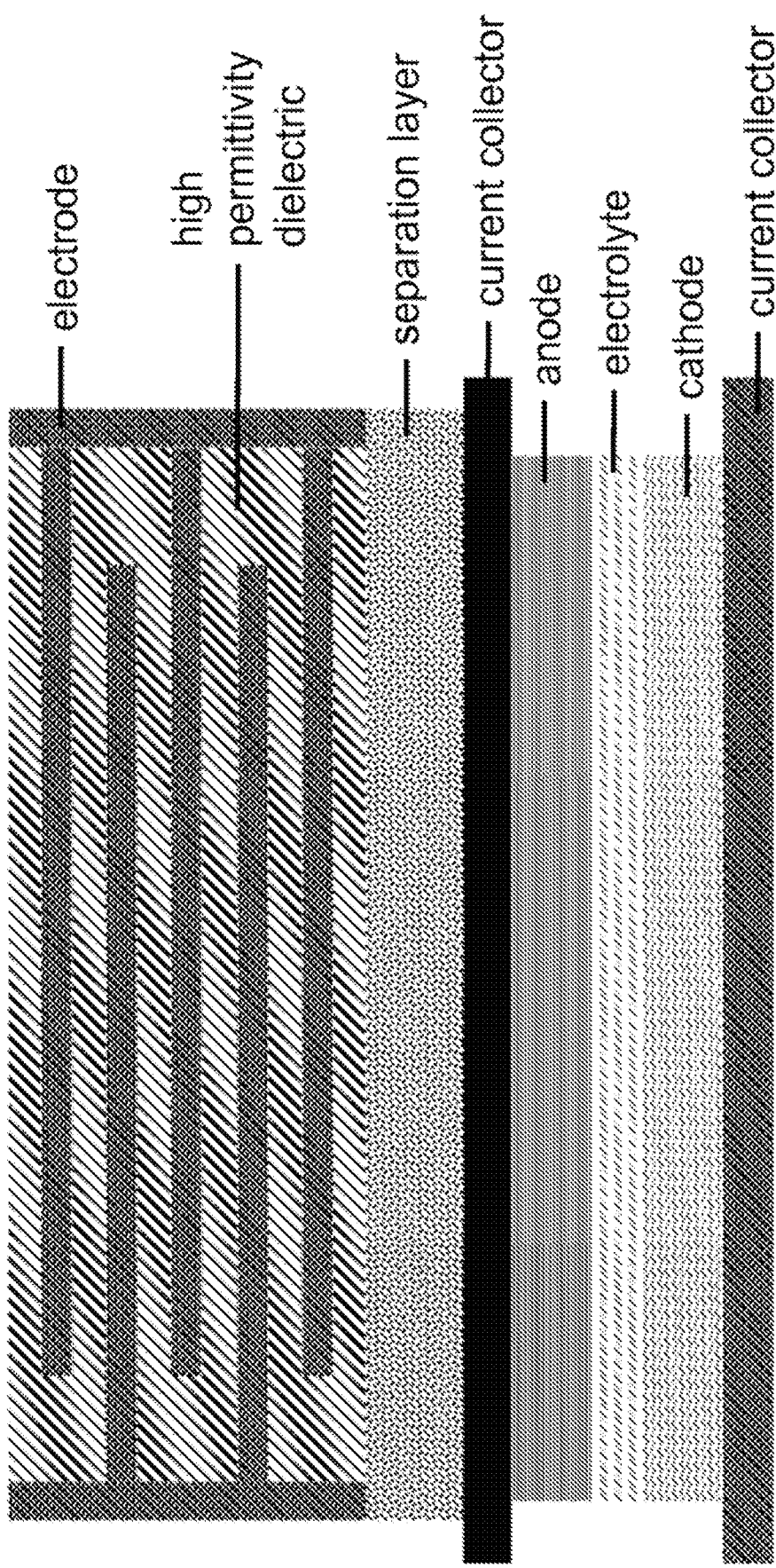
FIG. 4—Simplified cross sectional view of a unified structure including an integrated ultra-capacitor and a thin film battery.

EDLCs describe a class of energy-storage devices that incorporate active materials including high-surface-area carbons (activated carbons), electroactive polymers, transition metal oxides and nitrides. The separation materials include advanced dielectrics, conventional and advanced polymer electrolytes and ionic conducting materials. Electrodes arrangement can be symmetric or anti-symmetric. In FIG. 4 an anti-symmetric electrode arrangement is presented for the device electrodes. The electrodes of the capacitor can be formed by high-surface-area materials such as activated carbon of high capacitance redox-active materials such as metal oxides (e.g. hydrous ruthenium oxides, $RuO_2.0.5H_2O$) prepared by sol-gel methods with capacitance up to 700 F/g. Using anti-symmetric electrodes and different anode and cathode materials resulting in higher working voltages enhances the energy-storage capability of this element.

After assembly of the ultra-capacitor a separation layer of electrically insulating and thermally conductive aluminum nitride (AlN), having a thickness of 3-5 µm, is fabricated onto the dielectric material layer using PVD. This layer has the function of removing heat from the two elements and conveying it to a heat sink.

After the cooling element is completed, the battery components are deposited sequentially and conformally by a PVD process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A thin film battery device comprising two or more electro-chemistries, the thin film battery device comprising:
    a first thin film battery cell having a first electrochemistry and comprising a first cathode layer, a first electrolyte layer, and a first anode layer, the first cathode layer having a thickness of 3-5 µm;
    a second thin film battery cell having a second electrochemistry and comprising a second cathode layer, a second electrolyte layer, and a second anode layer, the second cathode layer having a thickness of 3-5 µm; and
    a thermally conductive layer disposed between the first and second thin film batteries,
    wherein the second thin film battery cell overlays the first thin film battery cell, and the first electrochemistry of the first thin film battery cell is different than the second electrochemistry of the second thin film battery cell, and
    wherein the thermally conductive layer comprises aluminum nitride.

2. The thin film battery device of claim 1, comprising a separation layer deposited between the first thin film battery cell and the second thin film battery cell.

3. The thin film battery device of claim 1, wherein the first thin film battery cell comprises a first cathode current collector and a first anode current collector, and wherein the second thin film battery cell comprises a second cathode current collector and a second anode current collector.

4. The thin film battery device of claim 1, wherein the first thin film battery cell and the second thin film battery cell are deposited using a physical vapor deposition (PVD) process.

5. The thin film battery device of claim 1, wherein the first electrolyte layer comprises lithium and the second electrolyte layer comprises lithium.

6. The thin film battery device of claim 1, wherein the first electrolyte layer comprises lithium phosphorous oxynitride (LIPON).

7. The thin film battery device of claim 1, wherein the first electrolyte layer is 1-3 µm thick.

8. The thin film battery device of claim 1, wherein the second electrolyte layer comprises lithium phosphorous oxynitride (LIPON).

9. The thin film battery device of claim 1, wherein the second electrolyte layer is 1-3 μm thick.

10. The thin film battery device of claim 1, wherein the first cathode layer comprises lithium iron phosphate (LiFePO$_4$).

11. The thin film battery device of claim 1, wherein the second cathode layer comprises a lithium manganese oxide (LiMn$_2$O$_4$).

12. The thin film battery device of claim 1, wherein the first anode layer and the second anode layer comprise lithium.

13. The thin film battery device of claim 1, wherein the first anode layer and the second anode layer are 3-5 μm thick.

14. A method of making the thin film battery device according to claim 1, the method comprising two or more electro-chemistries comprising:
    forming the first thin film battery cell having a first electrochemistry and comprising:
        depositing the first cathode layer having a thickness of 3-5 μm;
        depositing the first electrolyte layer on the first cathode layer; and
        depositing the first anode layer on the first electrolyte layer; and
    depositing the thermally conductive layer between the first thin film battery cell and the second thin film battery cell; and
    depositing the second thin film battery cell on the first thin film battery cell comprising:
        depositing the second cathode layer having a thickness of 3-5 μm on a first substrate comprising the first thin film battery cell;
        depositing the second electrolyte layer on the second cathode layer; and
        depositing the second anode layer on the second electrolyte layer,
    wherein the electrochemistry of the first thin film battery cell is different than the electrochemistry of the second thin film battery cell; and
    wherein the thermally conductive layer comprises aluminum nitride.

15. The method of making a thin film battery device of claim 14,
    wherein the first cathode layer, the first electrolyte layer, the first anode layer, the second cathode layer, the second electrolyte layer, and the second anode layer are deposited using physical vapor deposition processes.

16. The method of making a thin film battery device of claim 14,
    wherein the first thin film battery cell comprises a first cathode current collector and a first anode current collector, and wherein the second thin film battery cell comprises a second cathode current collector and a second anode current collector.

17. The method of making a thin film battery device of claim 14,
    wherein the first electrolyte layer comprises lithium and the second electrolyte layer comprises lithium.

18. The method of making a thin film battery device of claim 14, wherein the first electrolyte layer comprises lithium phosphorous oxynitride (LIPON).

19. The method of making a thin film battery device of claim 14, wherein the first electrolyte layer is 1-3 μm thick.

20. The method of making a thin film battery device of claim 14, wherein the second electrolyte layer comprises lithium phosphorous oxynitride (LIPON).

21. The method of making a thin film battery device of claim 14, wherein the second electrolyte layer is 1-3 μm thick.

22. The method of making a thin film battery device of claim 14, wherein the first cathode layer comprises lithium iron phosphate (LiFePO$_4$).

23. The method of making a thin film battery device of claim 14, wherein the second cathode layer comprises a lithium manganese oxide (LiMn$_2$O$_4$).

24. The method of making a thin film battery device of claim 14, wherein the first anode layer and the second anode layer comprise lithium.

25. The method of making a thin film battery device of claim 14, wherein the first anode layer and the second anode layer are 3-5 μm thick.

* * * * *